United States Patent
Torng et al.

(10) Patent No.: US 10,733,039 B2
(45) Date of Patent: Aug. 4, 2020

(54) EFFECTIVE CHIP YIELD FOR ARTIFICIAL INTELLIGENCE INTEGRATED CIRCUIT WITH EMBEDDED MEMORY

(71) Applicant: Gyrfalcon Technology Inc., Milpitas, CA (US)

(72) Inventors: Chyu-Jiuh Torng, Dublin, CA (US); Daniel H. Liu, San Jose, CA (US); Wenhan Zhang, Mississauga (CA); Hualiang Yu, San Jose, CA (US)

(73) Assignee: Gyrfalcon Technology Inc., Milpitas, CA (US)

( * ) Notice: Subject to any disclaimer, the term of this patent is extended or adjusted under 35 U.S.C. 154(b) by 38 days.

(21) Appl. No.: 16/230,020

(22) Filed: Dec. 21, 2018

(65) Prior Publication Data

US 2020/0201697 A1 Jun. 25, 2020

(51) Int. Cl.
*G06F 11/00* (2006.01)
*G06F 11/07* (2006.01)
*G11C 29/18* (2006.01)
*G11C 29/44* (2006.01)
*G06N 3/063* (2006.01)

(52) U.S. Cl.
CPC .......... *G06F 11/076* (2013.01); *G06N 3/063* (2013.01); *G11C 29/18* (2013.01); *G11C 29/44* (2013.01); *G11C 2029/1806* (2013.01)

(58) Field of Classification Search
None
See application file for complete search history.

(56) References Cited

U.S. PATENT DOCUMENTS

| | | | |
|---|---|---|---|
| 8,121,046 B2* | 2/2012 | Morrison | H04L 1/203 370/252 |
| 2004/0025086 A1* | 2/2004 | Gorday | G01R 31/317 714/37 |
| 2010/0060310 A1* | 3/2010 | Laisne | H01L 25/0657 326/10 |
| 2014/0245105 A1* | 8/2014 | Chung | G06F 11/1048 714/763 |
| 2019/0045515 A1* | 2/2019 | Kwasnick | H04W 12/12 |
| 2019/0318798 A1* | 10/2019 | Frolikov | G06F 11/0793 |

* cited by examiner

*Primary Examiner* — Mujtaba M Chaudry
(74) *Attorney, Agent, or Firm* — Brinks Gilson & Lione

(57) ABSTRACT

This disclosure relates to testing of integrated artificial intelligence (AI) circuit with embedded memory to improve effective chip yield and to mapping addressable memory segments of the embedded memory to multilayer AI networks at the network level, layer level, parameter level, and bit level based on bit error rate (BER) of the addressable memory segments. The disclosed methods and systems allows for deployment of one or more multilayer AI networks in an AI circuit with sufficient model accuracy even when the embedded memory has an overall BER higher than a preferred overall threshold.

20 Claims, 9 Drawing Sheets

EFFECTIVE CHIP YIELD FOR ARTIFICIAL INTELLIGENCE INTEGRATED CIRCUIT WITH EMBEDDED MEMORY

TECHNICAL FIELD

This disclosure relates to testing of integrated artificial intelligence (AI) circuit with embedded memory to improve effective chip yield and further relates to mapping addressable memory segments of the embedded memory to multilayer AI networks at a model/network level, network layer level, parameter level, and bit level of model parameters based on bit error rate (BER) of the addressable memory segments.

BACKGROUND

Integrated circuit designed for artificial intelligence (AI) processing may be embedded with memory for storing model parameters for one or more AI models/networks. The AI models/networks, for example, may include a plurality of multilayer deep learning neural networks requiring a large amount of memory for storing their model parameters. Even though deployment of AI models/networks may have more relaxed memory bit error rate (BER) requirement compare to other applications, AI circuits with embedded memory having BER higher than such a relaxed requirement are typically discarded at a testing stage regardless of the specifics of the AI models/networks to be deployed in the AI circuits, leading to relatively lower chip yield.

SUMMARY

This disclosure is directed to testing of integrated artificial intelligence (AI) circuit with embedded memory to improve effective chip yield and is further directed to mapping addressable memory segments of the embedded memory to multilayer AI models/networks at the network level, layer level, parameter level, and bit level based on bit error rate (BER) of the addressable memory segments. The disclosed methods and systems allow for deployment of one or more multilayer AI models/networks in an AI circuit with sufficient model accuracy even when the embedded memory has an overall BER higher than a preferred overall BER threshold. Further objects, features, and advantages of this disclosure will become readily apparent to persons having ordinary skill in the art after a review of the following description, with reference to the drawings and claims that are appended to and form a part of this specification.

In one implementation, a method for testing an artificial intelligence integrated circuit (AIIC) is disclosed. The AIIC may include an embedded memory having multiple addressable memory segments for storing model parameters of one or more multilayer artificial intelligence (AI) networks. The method may include measuring a bit error rate (BER) for each memory segment of the multiple addressable memory segments of the embedded memory; determining whether an aggregated BER of the multiple addressable memory segments of the embedded memory is less than a predetermined overall BER threshold; and when the aggregated BER is less than the predetermined overall BER threshold, determining that the AIIC passes test. The method may further include, when the aggregated BER is not less than the predetermined overall BER threshold, identifying a set of priority model layers from model layers of the one or more multilayer AI networks; determining a subset of preferred memory segments each having BER less than the predetermined overall BER threshold from the multiple addressable memory segments; determining whether the subset of preferred memory segments are sufficient to hold all model parameters of the set of priority model layers; when the subset of preferred memory segments are sufficient to hold all model parameters of the set of priority model layers, determining that the AIIC passes test and mapping model parameters of the set of priority model layers to the subset of preferred memory segments; and when the subset of preferred memory segments are not sufficient to hold all model parameters of the set of priority model layers, determining that the AIIC fails test.

In the implementation above, the one or more multilayer AI networks may include a single multilayer AI network and the set of priority model layers comprise all model layers of the single multilayer AI network.

In any of the implementations above, the method may further include sorting the set of priority model layers in decreasing priority; sorting the subset of preferred memory segments in increasing BER; and mapping the set of priority model layers to the subset of preferred memory segments from higher priority and lower BER to lower priority and higher BER.

In any of the implementations above, the one or more multilayer AI networks may include a single multilayer AI network and the set of priority model layers may include a subset of model layers of the single multilayer AI network. The method may further include sorting model layers of the single multilayer AI network in decreasing priority; sorting the multiple addressable memory segments in increasing BER; and mapping the model layers of the single multilayer AI network to the multiple addressable memory segments from higher priority and lower BER to lower priority and higher BER.

In any of the implementations above, the one or more multilayer AI networks may include a plurality of multilayer AI networks. The method may further include dividing the plurality of multilayer AI networks into a set of priority multilayer AI networks and a remaining set of multilayer AI networks; and including all model layers of the set of priority multilayer AI networks into the set of priority model layers.

In any of the implementations above, the one or more multilayer AI networks comprise a plurality of multilayer AI networks and the set of priority model layers may include at least one model layer from each of the plurality of multilayer AI networks.

In any of the implementations above, mapping model parameters of the set of priority model layers to the subset of preferred memory segments may include sorting the set of priority model layers in decreasing priority; sorting the subset of preferred memory segments in increasing BER; and mapping the set of priority model layers to the subset of preferred memory segments from higher priority and lower BER to lower priority and higher BER.

In any of the implementations above, the method may further include, when the subset of preferred memory segments are sufficient to hold model parameters of the set of priority model layers, mapping model parameters of model layers other than the set of priority model layers to memory segments of a plurality of memory segments other than memory segments of the subset of preferred memory segments that are already mapped to the set of priority model layers.

In any of the implementations above, mapping model parameters of model layers other than the set of priority model layers to memory segments of the plurality of memory segments other than memory segments of the subset of preferred memory segments that are already mapped to the set of priority model layers may include sorting the model layers other than the set of priority model layers in decreasing priority; sorting the memory segments other than the memory segments of the subset of preferred memory segments that are already mapped to the set of priority model layers in increasing BER; and mapping the model layers other than the set of priority model layers to the memory segments other than the memory segments of the subset of preferred memory segments that are already mapped to the set of priority model layers from higher priority and lower BER to lower priority and higher BER.

In any of the implementations above, at least one of the set of priority model layers takes two or more memory segments to hold. The method, when mapping model parameters of the set of priority model layers to the subset of preferred memory segments, may further include sorting model parameters in the at least one of the set of priority model layers that takes at least two memory segments to hold according to a parameter priority; and mapping the at least one of the set of priority model layers that takes at least two memory segments to hold into the subset of preferred memory segments according to the parameter priority and the sorted model parameters in the at least one of the set of priority model layers that takes at least two memory segments.

In any of the implementations above, mapping model parameters of the set of priority model layers to the subset of preferred memory segments may include packing bits of model parameters of the set of priority model layers to reorder the bits from most significant bits to least significant bits; and mapping the reordered bits of the model parameters of the set of priority model layers to the subset of preferred memory segments.

In any of the implementations above, the set of priority model layers may be further sorted in order of priority and packing bits of model parameters of the set of priority model layers is performed within each of the set of priority model layers.

In any of the implementations above, the set of priority model layers may be further sorted in order of priority and packing bits of model parameters of the set of priority model layers is performed across the set of priority model layers from most significant bits to least significant bits and in descending order of priority.

In any of the implementations above, the predetermined BER may be higher than 1%. In any of the implementations above, the method may further include removing, from the multiple addressable memory segments, memory segments having BER higher than a predetermined defective-segment BER threshold from mapping.

In another implementation, an integrated circuit is disclosed. The integrated circuit may include an artificial intelligence (AI) logic circuit for implementing one or more multilayer AI networks; embedded memory having multiple addressable memory segments in communication with the AI logic circuit for storing model parameters of the one or more multilayer AI networks; and a memory controller. The memory controller may be configured to maintain a first map of bit error rate (BER) for the multiple addressable memory segments at memory segment level; determine a subset of preferred memory segments each having BER less than a predetermined overall BER threshold from the multiple addressable memory segments; maintain a second map of priority level for model layers of the one or more multilayer AI networks; determine a set of priority model layers from model layers of the one or more multilayer AI networks; and when the subset of preferred memory segments are sufficient to hold all model parameters of the set of priority model layers, map model parameters of the set of priority model layers to the subset of preferred memory segments according to the first map and the second map.

In the implementation above, the one or more multilayer AI networks may include a single multilayer AI network and the set of priority model layers comprise all model layers of the single multilayer AI network.

In any of the implementations above the first map comprises mapping between BER and the multiple addressable memory segments in order of increasing BER and the second map comprises mapping between priority level and model layers of the one or more multilayer AI networks in order of decreasing priority level.

In any of the implementations above, the one or more multilayer AI networks comprise a plurality of multilayer AI networks, and the memory controller may be further configured to divide the plurality of multilayer AI networks into a set of priority multilayer AI networks and a remaining set of multilayer AI networks; and including all model layers of the set of priority multilayer AI networks into the set of priority model layers.

In any of the implementations above, the memory controller, when configured to map model parameters of the set of priority model layers to the subset of preferred memory segments according to the first map and the second map, may be further configured to pack bits of model parameters of the set of priority model layers to reorder the bits from most significant bits to least significant bits; and map the reordered bits of the model parameters of the set of priority model layers to the subset of preferred memory segments.

DETAILED DESCRIPTION

Figure 1:
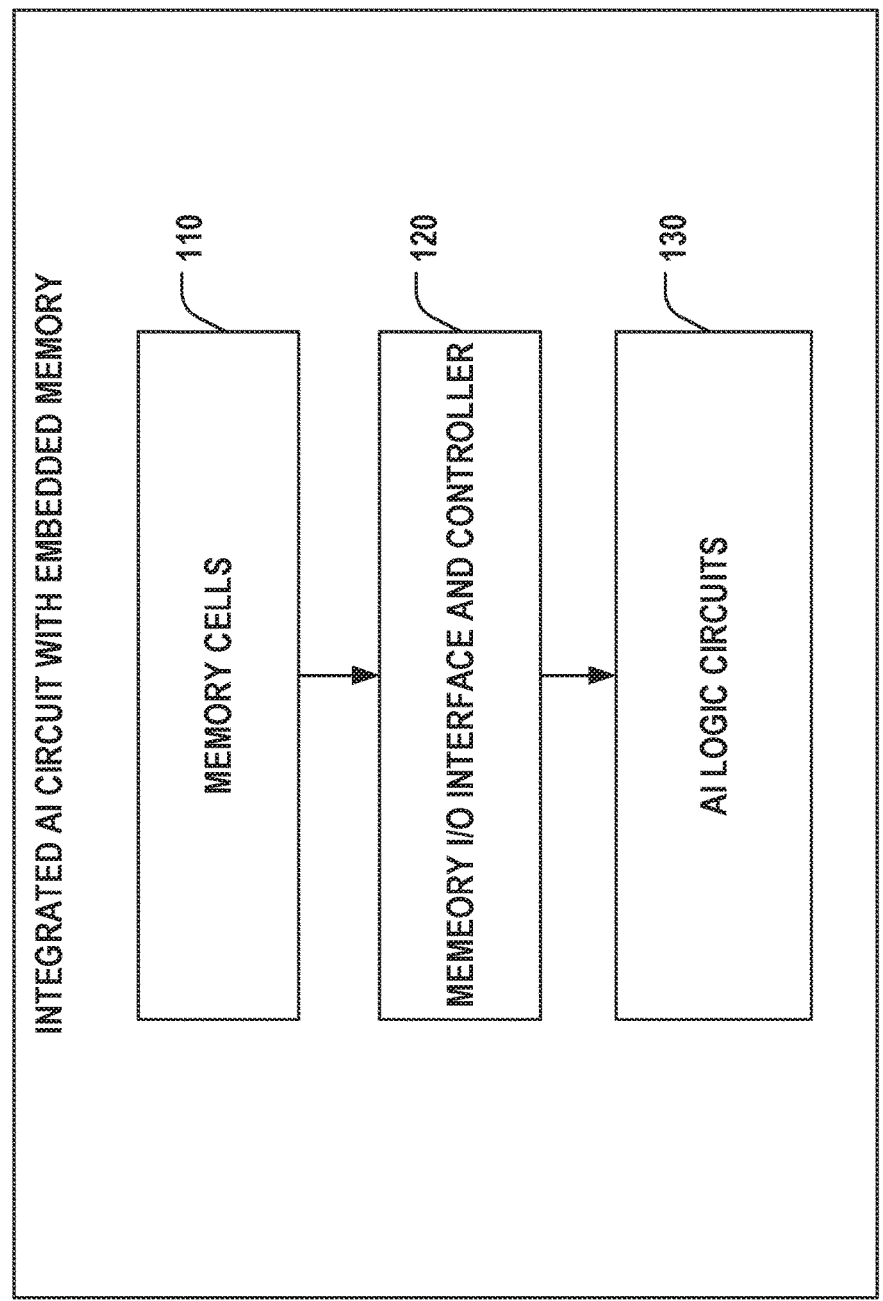
FIG. 1 shows an architectural diagram of an exemplary integrated artificial intelligence (AI) circuit with embedded memory for storing AI model parameters.

This disclosure is directed to testing of integrated artificial intelligence (AI) circuit with embedded memory in the presence of relatively large bite error rate (BER) in the embedded memory cells. This disclosure is further directed to using the test process and results to generate intelligent mapping between addressable memory segments of the embedded memory and model parameters in complex AI applications. The methods and systems disclosed herein are capable of improving effective chip yield of the integrated AI circuits without using spare memory segments or error correction bits and without causing unacceptable compromise on performance of the AI models deployed in the integrated AI circuits.

AI models or AI networks have been widely used for processing a large amount of input data to extract categorical and other information. These models, in turn, may then be incorporated into a wide range of applications to perform various intelligent tasks. For example, deep learning techniques based on convolutional neural networks (CNNs) may provide trained CNN models for processing particular types of input data. For example, a CNN model may be trained to analyze an input image and classify the input image into one of a predetermined set of image categories. For another example, a CNN model may be trained to produce segmentation of an input image in the form of, e.g., output segmentation masks. Such segmentation masks, for example, may be designed to indicate where particular types of objects are located in the image and their boundaries.

A deep learning CNN model, may typically contain multiple cascading convolutional, pooling, rectifying, and fully connected layers of neurons, with millions of kernel, weight, and bias parameters. These parameters may be determined by training the model using a sufficient collection of labeled input data. Once a CNN model is trained and the model parameters are determined, it may be used to process unknown input data and to predict labels for the unknown input data. These labels may be classification labels, segmentation masks, or any other type of labels for the input data.

In a training process of a CNN model, each of a large number of labeled training datasets is forward propagated through the layers of neurons of the CNN network embedded with the training parameters to calculate an end labeling loss. Back propagation is then performed through the layers of neurons to adjust the training parameters to reduce labeling loss based on gradient descent. The forward/back propagation training process for all training input datasets iterates until the neural network produces a set of training parameters that provide converging minimal overall loss for the labels predicted by the neural network over labels given to the training datasets. A converged model then includes a final set of training parameters and may then be tested and used to process unlabeled input datasets via forward propagation. Such a CNN model typically must be of sufficient size in terms of number of layers and number of neurons/features in each layer for achieving acceptable predictive accuracy. The number of training parameters is directly correlated with the size of the neural network, and is typically extraordinarily large even for a simple AI model (on the order of millions, tens of millions, hundreds of millions, and thousands of millions of parameters). The forward and back propagations thus require a massive amount of memory to hold these parameters and extensive computation power for iteratively calculating states of a massive number of neurons.

Complete AI models may be deployed in edge devices without relying on any backend AI servers. Edge devices may include but are not limited to mobile phones and any other devices, such as Internet-of-Things (IoT) devices. Performing AI tasks locally in edge devices rather than in backend servers may be desired, particularly when an input dataset is large (e.g., high-resolution 2D or 3D images), and when transmission of the input dataset from the edge device to the backend servers may consume an unacceptable or unsupported level of communication bandwidth and/or power. Further, for some edge devices, completely local AI processing may be the only choice when there is only intermittent communication network connection or no communication network connection at all.

In such applications, the CNN model may reside on the edge devices. As such, the edge devices designed for these applications must include sufficient memories adapted to the needs for storing various types of model parameters of the CNN model. These memories may further be embedded with a CNN logic circuit on a same semiconductor substrate for reducing power dissipation, reducing latency, and increasing data access speed. These embedded memories may be of single type or mixed types, as disclosed, for example, in the U.S. patent application Ser. Nos. 16/050,679, 15/989,515, 15/838,131, 15/726,084, 15/642,100, 15/642,076 filed respectively on Jul. 31, 2018, May 25, 2018, Dec. 11, 2017, Oct. 5, 2017, Jul. 5, 2017, and Jul. 5, 2017, which are herein incorporated by reference in their entireties.

An example of a core integrated AI circuit with embedded memory is shown in FIG. 1. The memory may be implemented as memory cells 110 embedded with the AI logic circuit 130. In some implementations, an embedded memory I/O interface and controller 120 may be used to facilitate memory mapping and data access by the AI logic circuits 130. The AI logic circuits, for example, may be specifically designed to provide parallel processing of various forward propagation paths through the layers of neurons of a CNN network. The memory cells 110 may be a single type or mixed types of memories adapted to needs of various types of model parameters with respect to, e.g., access frequency, access speed, and persistency.

Embedded memory cells 110 may be arranged in arrays. For application involving complex AI processing, the required embedded memory cell arrays may be very large in size in order to accommodate potentially large number of model parameters. Memory cell arrays may contain defective memory cells as a result of imperfect manufacturing processes. These defective memory cells may be identified from the memory array during a memory testing process. The extent to which the memory cells are defective in a memory array may be represented by bit error rate (BER). The BER, for example, may be defined as a ratio between a number of defective memory cells and a total number of memory cells in a memory array. Memory cells in the memory array may be addressed during operation in unit of addressable memory segments. An addressable memory segment may be alternatively referred to as a memory block. An overall BER may be determined for the entire memory array during testing. Alternatively, a BER may also be determined for each individual addressable memory segment.

Memory arrays are typically manufactured with spare memory segments such that memory segments having defective memory cells may be skipped and replaced by memory segments from a repository of spare memory segments. This process may be dynamic in that memory cells may become defective during use, and a memory controller may be configured to replace the corresponding defective memory segments with memory segments from the repository of spare memory segments. Alternatively, defective memory cells may be correctable using additional error correction bits and error correction code. But in either of the approaches above, redundancy is required for either removing or correcting memory errors, leading to increased size for circuits with embedded memories.

Unlike other applications requiring a large amount of memory, AI applications are generally more tolerant to memory bit errors. Due to the large number of model parameters and the typically well-defined and small number of outputs (e.g., a limited number of predefined categories for an AI classifier), an AI model may still perform with acceptable accuracy with BER up to a certain predetermined overall BER threshold value. Such a predetermined overall BER threshold value, for example may be 1%, 2%, 3%, or even higher values. When the overall memory BER of an integrated AI circuit with embedded memory is below such an overall BER threshold value, the integrated AI circuit may be considered acceptable without any need of spare memory segments or error correction bits.

As will be shown in more detail below, memory error tolerance may be disparate between different AI models, between different network layers within a same AI model, between different parameters within a same network layer, and between different bit positions of parameters. As such, embedded memory in an integrated AI circuits may be adaptively and intelligently mapped to model parameters at network (model) level, network layer level, parameter level, and/or bit level. Under such mapping, an integrated AI circuit with embedded memory may be used to store AI models with acceptable performance accuracy and without memory redundancy even when the overall BER of the embedded memory may be larger than the predetermined overall BER threshold value.

Figure 2:
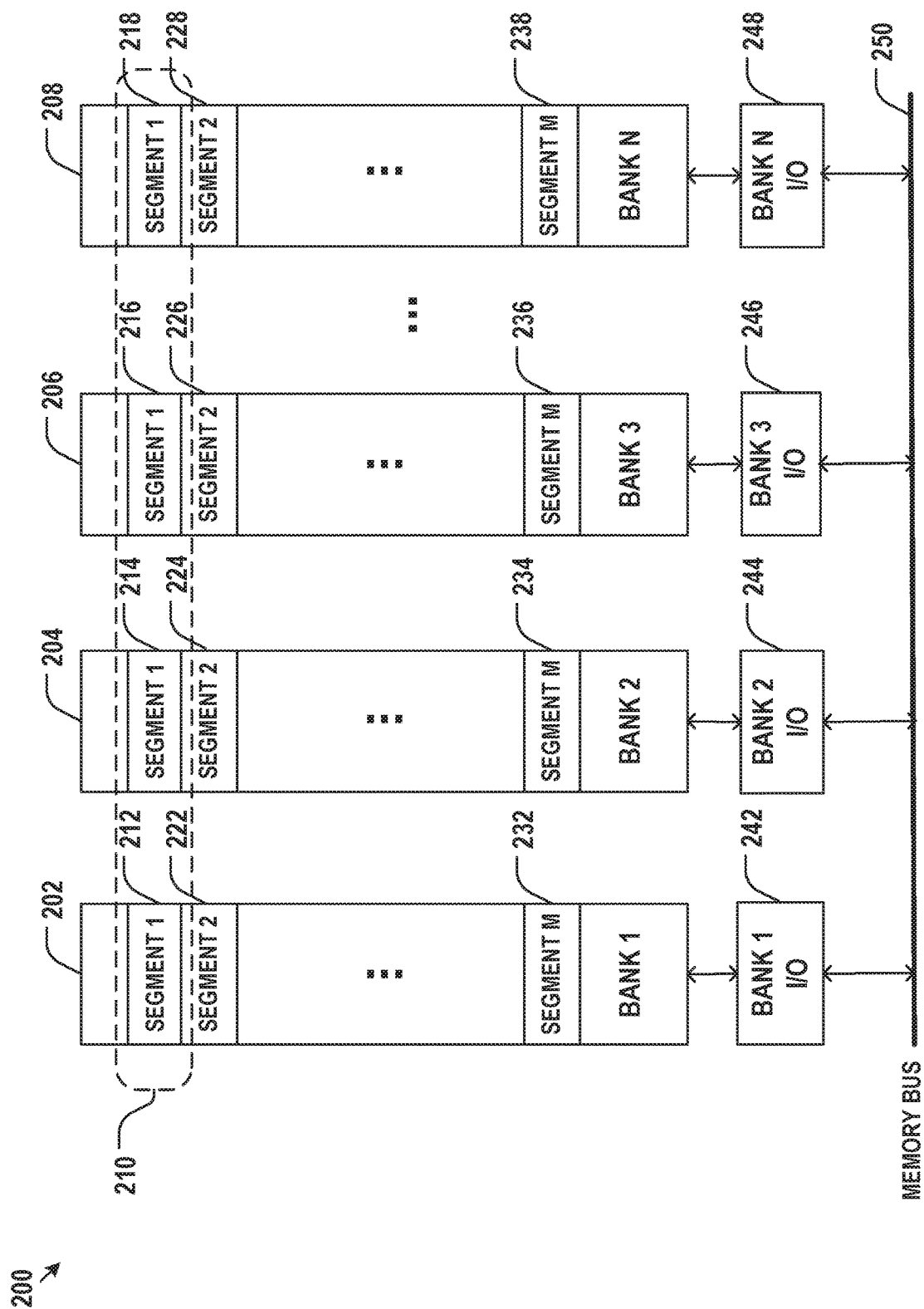
FIG. 2 illustrates an exemplary architecture for memory embedded with an integrated AI circuit.

FIG. 2 illustrates an exemplary arrangement 200 of embedded memory cells in an integrated AI circuit. The memory cell may be arranged in banks, such as bank 1 (202), bank 2 (204), bank 3 (206), and bank N (208), each connected to memory bus 250 via independent I/O interface 242, 244, 246, and 248. Each bank may include multiple addressable memory segment, such as segment 1 (212, 214, 216, and 2118), segment 2 (222, 224, 226, and 228), and segment M (232, 234, 236, and 238). A memory segment in FIG. 2 may be alternatively referred to as a memory block. A collection of memory segments from different memory banks such as the memory segment collection 210 including segments 212, 214, 216, and 218 may be referred to as a memory segment macro. A memory segment macro or memory block macro may be alternatively referred to as a memory page. Although the memory segment macro 210 is illustrated in FIG. 2 as collection of memory segments at similar positions (or address offsets) in each memory bank, a memory segment macro may alternatively contain memory segments at different positions (or address offsets) from the memory banks. For example, a memory segment macro may alternative include memory segments 212, 224, 236, and 218.

Figure 3:
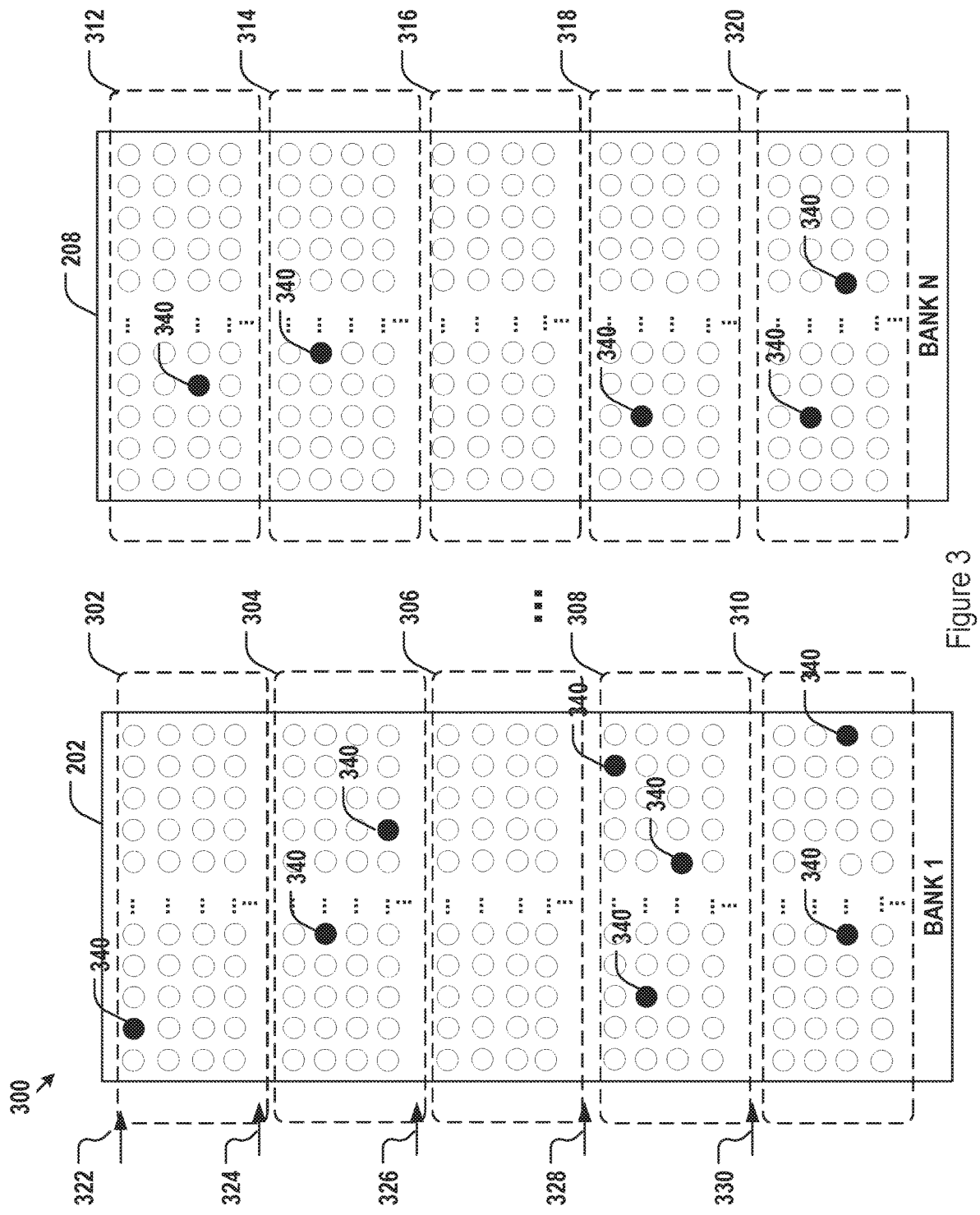
FIG. 3 illustrates exemplary error bit distribution in the embedded memory of FIG. 2.

FIG. 3 further illustrate the embedded memory cells 300 with bit errors. In particular, FIG. 3 shows memory segments 302-310 for bank 1 (202) and memory segments 312-320 for bank N (208). The memory segments 302, 304, 306, 308, and 310, for example, are addressable with offsets 322, 324, 326, 328, and 330, respectively. Each circle in FIG. 3 represent a memory cell. The filled circles 340 indicate defective memory cells.

The defective cells 340 of FIG. 3 may, for example, be identified during memory testing. Based on such testing, BER may be determined at various levels. For example, an overall BER may be determined for the entire embedded memory array including all memory banks. In the particular example shown in FIG. 3, assuming the circles shown are all the memory cells, the overall BER may be determined as 3.25% (13 defective memory cells over 400 total memory cells). BER may be further determined at bank level. For the example shown in FIG. 3, BER of bank 1 (202) may be determined as 4% (8 defective memory cells over 200 total memory cells) whereas BER of bank N (208) may be determined as 2.5% (5 defective memory cells over 200 total memory cells). Further, BER may be determined at segment level. For the example of FIG. 3, BER for segments 302, 304, 306, 308, 310, 312, 314, 316, 318, and 320 may be determined as 2.5%, 5%, 0%, 7.5%, 5%, 2.5%, 2.5%, 0%, 2.5%, and 5%, respectively. In this example, assuming that the overall predetermined acceptable overall BER threshold for AI application is 3%, the embedded memory 300, having a BER of 3.25%, would be worse than the acceptable overall threshold. At memory bank level, bank 1 would not be acceptable (with a BER of 4%) wherein bank N would be acceptable (with an BER of 2.5%)

The memory cells of FIGS. 2 and 3 may be based on magnetic random access memory (MRAM). Integrated AI circuit with embedded MRAM cell may be fabricated based on a CMOS fabrication technology. Exemplary implementation for integrating CNN logic circuits and MRAM may be found in U.S. patent application Ser. No. 15/989,515, U.S. patent application Ser. No. 15/838,131, U.S. patent application Ser. No. 15/726,084, U.S. patent application Ser. No. 15/642,100, and U.S. patent application Ser. No. 15/642,076 by the same Applicant as the current application, which are incorporated herein by reference in their entireties. For example, the embedded MRAM cell may be based on spin torque transfer (STT) type of magnetic tunnel junctions (MTJs). Each MTJ may include a magnetic tunnel layer sandwiched between a free magnetic layer and a pinned magnetic layer. The free magnetic layer of the MTJ layer may comprise $Co_xFe_yB_z$, $Fe_xB_y$, $Fe_xB_y/Co_xFe_yB_z$, $Co_xFe_yB_z/Co_xFe_yB_z$, $Co_xFe_yB_z/M/Co_xFe_yB_z$, $Fe_xB_y/M/Fe_xB_y$ or $Fe_xB_y/Co_xFe_yB_z/M/Co_xFe_yB_z$, wherein M is metal.

These MRAM cells may be designed to achieve read access time faster than 10 nanosecond, faster than 5 nanosecond, or faster than 2 nanosecond. These MRAM cells may further be designed with high density and small cell size. For an MRAM cell, the MTJ may be formed with a width raging from 20 nm to 200 nm.

Those having ordinary skill in the art understand that the memory cells based on MRAM above are merely an example. Other memory technologies may also be used. These technologies may include, but are not limited to, phase change random access memory (PCRAM), resistive random access memory (RRAM), and static random access memory (SRAM). An example for implementation of RRAM is described in U.S. patent application Ser. No. 15/989,515 by the same Applicant, filed with the U.S. Patent Office on May 25, 2018, the entirety of which is herein incorporated by reference.

Figure 4:
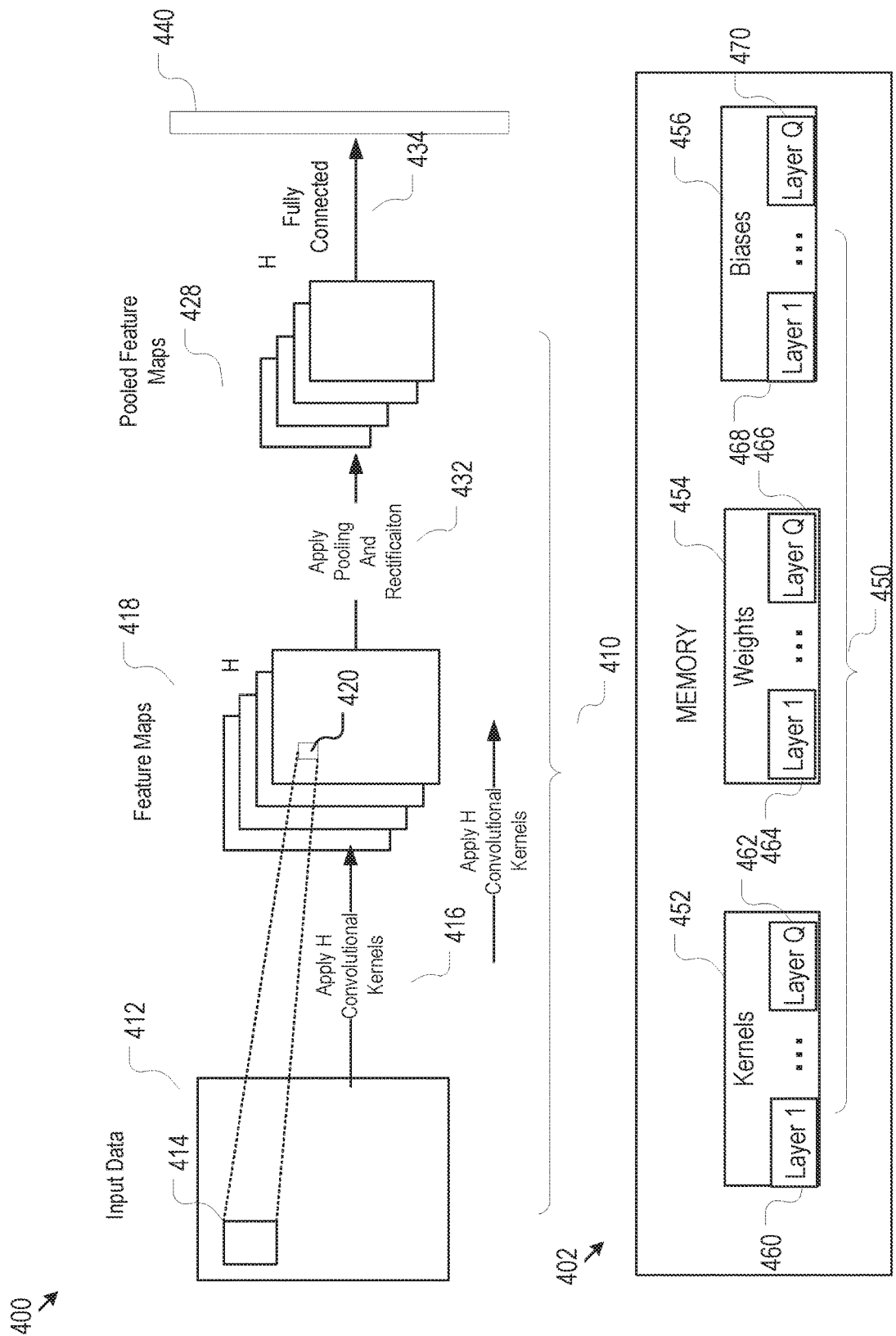
FIG. 4 illustrates an exemplary convolutional neural network (CNN) model having various types of model parameters that may be stored in the embedded memory of FIG. 1.

FIG. 4 illustrates a simplified exemplary multilayer CNN model 400 and storage of its model parameters in embedded memory 402. For example, the CNN model may include multiple repetitions/cascading of convolution, pooling, and rectification layers 410. For simplicity, FIG. 4 only shows one of such repetitions. In particular, the CNN model may include a feature extraction layer for perform sliding convolution 416 across the input data 412 between a plurality (H) of features 414 (one feature is shown) with the input data 412 (shown as a two dimensional data matrix in this example), generating H feature maps 418. These features 414 may be alternatively referred to as convolution kernels 414 or filters 414. Each convolution between a kernel 414 and a portion of the input data 412 is represented by 420. The number of Feature maps (H) is determined by a number of features. The feature maps 418 may then be pooled (e.g., via max pooling) and rectified (432) to generate pooled and rectified feature maps 428, The convolutional, pooling and rectification layers 410 may be repeated multiple times and final pooled feature maps 428 may then be mapped via connection 434 to fully connected layer 440, containing, for example, output categories. The fully connected layer 440, in turn, may include multiple stacked hidden layers (not shown) before the final category layer.

The CNN model 400 is essentially manifested as a set of model parameters 450, these parameters may include but are not limited to the convolution features or kernels 414, the weights and biases for the various connections between neurons within the fully connected layer 440. These model parameters may be stored in the embedded memory 402 as convolutional kernels 452, weights 454, and biases 456. These parameters may be part of various neural network layers in the CNN model 400 and the layers (e.g., layer 1 to layer Q) for these parameters may be tracked, as shown by 460, 462, 464, 466, 468, and 470 in FIG. 4.

For the CNN model 400, an overall bit error tolerance characteristics may be measured and determined precisely or statistically. In one implementation for determining the overall bit error tolerance characteristics for the trained CNN model, a predetermined number of bits in the model parameters may be intentionally inverted in a random manner among all bits of all model parameters. The randomly inverted model parameters may then be used for forward propagation of the training data (or other pre-labeled data not used for training) to produce outputs. Prediction error rate (as determined by comparing the outputs to pre-labels) may be recorded for a set of input data. The process may be repeated for different set of random bit inversions of the same predetermined number of inverted bits. The process above may further be repeated for inverting different predetermined numbers of bits (one bit, 2 bit, 3 bit, etc.). The various prediction error rates determined above for different number of inverted bits may be weight-averaged (or collectively processed in other manners) to represent the overall bit error tolerance characteristics for the trained model. This determination process may be performed by a sufficiently reliable system. In other words, the system used for such determination may not introduce other unpredictable errors in any significant manner.

As such, overall bit error tolerance for different AI models may be determined as discussed above. In the situation where an integrated AI circuit with embedded memory is designed to run multiple AI models, the overall bit error tolerance of each of the multiple AI models may be determined. As will be shown in more detail below, the different models may then be mapped to different memory segments of the embedded memory having different BERs according to the overall bit error tolerance of each of the multiple AI models.

Within the CNN model 400 of FIG. 4, some network layers may be less tolerant in bit error than other network layers. As such, parameters within those network layers with less bit error tolerance may more critically affect the performance of the CNN model. For example, the first convolutional layer of and the last fully connected layer of the CNN model 400 may be the most sensitive to bit errors due to their close proximity to either the input data or the output of the CNN model. For these more sensitive network layers, memory bit errors may cause more significant impact on the model accuracy than other network layers. In one implementation, the network layers of the CNN model 400 may be sorted according to a layer priority. Higher priority layer are more sensitive (less tolerant) to memory bit errors. The ranking of the network layers may be determined by simulating the model against bit errors in each particular network layer, similar to the statistical approach discussed above for determining the bit error tolerance at the model/network level. As will be disclosed in more detail below, once the bit error tolerance for each network layer is determined, model parameters of different network layers may be mapped to the memory segments of the embedded memory having different BERs according to the bit error tolerance of the network layers.

Further, different parameters, such as different kernels (or filters) may be more sensitive to bit errors than other parameters within the same network layer of the CNN model of FIG. 4. Sensitivity to bit errors thus may be statistically determined at the parameter level. As will be disclosed in more detail below, once bit error tolerance at parameter level is determined, model parameters of different bit error sensitivity may be mapped to the memory segments of the embedded memory having different BERs according to the bit error sensitivity of the model parameters.

Furthermore, different bit positions of model parameters may be more sensitive to bit errors than other bit positions of the model parameters for the CNN model of FIG. 4. Sensitivity to bit errors thus may be statistically determined at the bit level. As will be disclosed in more detail below, once bit error tolerance at bit level is determined, bits of model parameters of different bit error sensitivity may be interleaved or scrambled and then mapped to the memory segments of the embedded memory having different BERs according to the bit error sensitivity of the model parameters at the bit level.

Figure 5:
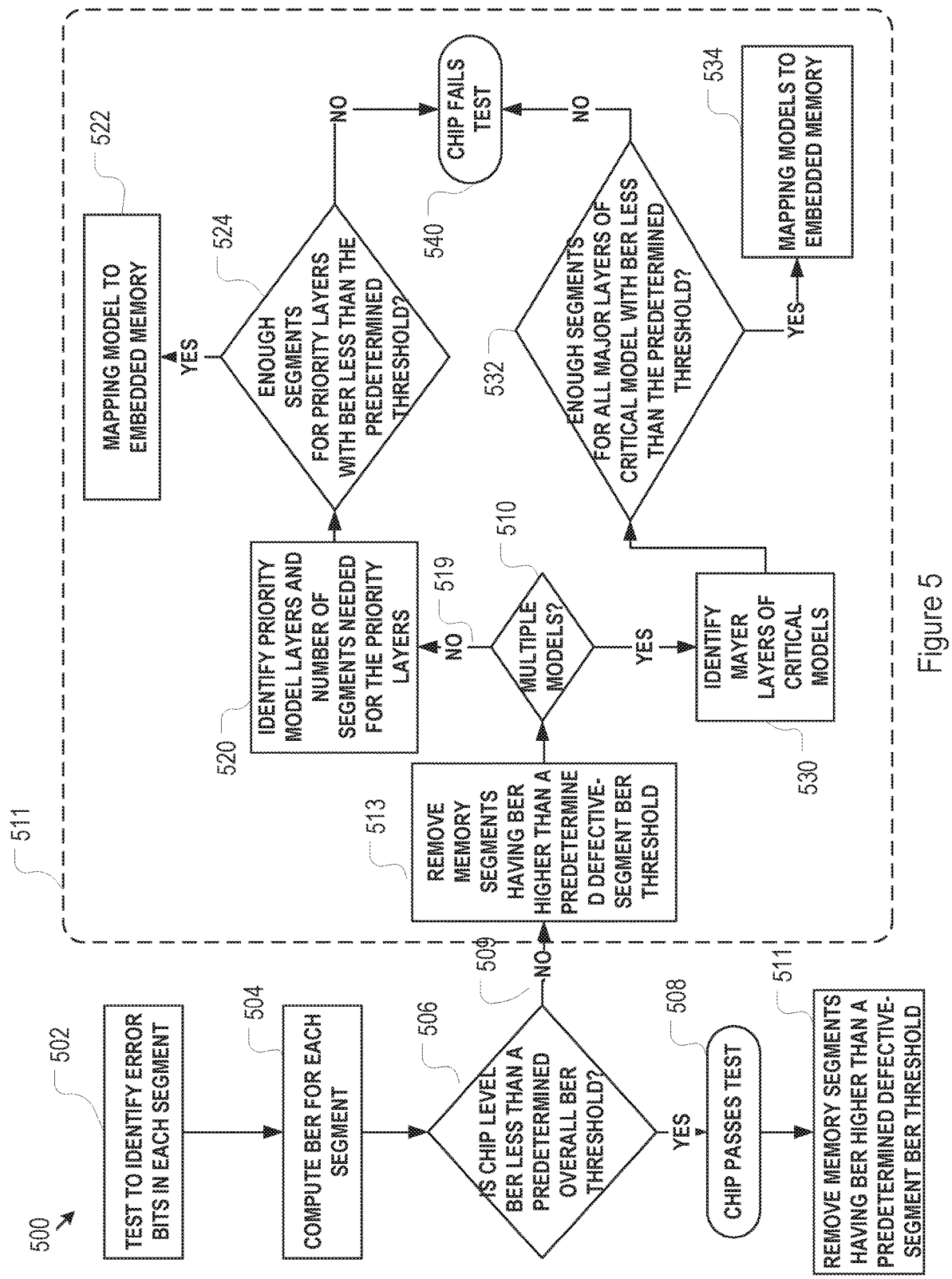
FIG. 5 shows an exemplary logic flow for testing the embedded memory of the integrated AI circuit of FIG. 2 and mapping the embedded memory to model parameters of AI networks.

FIG. 5 shows an exemplary logic flow 500 for testing embedded memory of an integrated AI circuit and for mapping the embedded memory to AI model(s). Using the logic flow 500, the embedded memory may be used to store the AI model(s) in the presence of high overall memory BER and without memory redundancy and without unacceptable level of compromise on the overall performance of the AI models.

The memory segments are first tested to determine error bits (502). Then BER for each memory segment may be determined (504). It may then be determined in 506 whether an overall BER of the embedded memory is below a predetermined overall BER threshold (e.g., 3%). If it is determined that the overall BER is below the predetermined overall BER threshold, then the integrated AI circuit is determined, in 508, to have passed test, and the AI models may not need to be mapped to the memory segments in any particular manner (although the AI models could still be mapped at various levels in the manners described below). Optionally, the memory segments with BER that is higher than a predetermined defective-segment BER threshold may be marked and removed, as shown in 511. Memory segments having BER higher than the defective-segment BER threshold may generate error that are too excessive to be usable even for the most bit error tolerant models, network layers, and/or model parameters. Such defective-segment BER threshold may be determined empirically or in other manners. It may be higher than the predetermined overall BER threshold. For example, it may be 4%, 5%, 6%, or other percentage values. The removal of defective segments, for example, may be implemented by the memory controller 120 of FIG. 1. In particular, the memory controller 120 may keep track of the defective memory segments such that they are not mapped for storage of the AI models, network layers, and model parameters.

When it is determined that the overall BER is not below the predetermined BER overall threshold, as shown in 509 of FIG. 5, a memory mapping process 511 is performed at the model level, the network layer level, the parameter level, and/or the bit level. Optionally in process 511, high BER memory segments (with BER higher than the defective-segment BER threshold) may be removed or mapped out in process 513, similar to the process 511 described above. As next step in process 511, it is determined whether multiple AI models are to be loaded into the embedded memory (510). If it is determined that a single AI model is to be loaded (519), priority network layers of the single AI model may be identified and a number of memory segments needed for storing the priority network layers may be determined (520). The priority network layers may be determined based on bit error sensitivity of the network layers of the single AI model. It is then determined whether there are enough memory segments having BER less than the predetermined overall BER threshold to hold the priority network layers (524). If there are enough such memory segments, the single AI model is mapped to the embedded memory (522). If there are not enough such memory segments, it is determined that the integrated AI circuit chip fails the test (540).

Returning to process 510 of FIG. 5, when it is determined that there are multiple AI models to be loaded into the embedded memory, priority layers of priority models may be first identified (530). Priority models may be identified based on model sensitivity to bit errors. Priority network layers of the priority models may also be identified based on layer sensitivity to bit errors. It is then determined whether there are enough memory segments having BER less than the predetermined overall BER threshold to hold the priority network layers of the priority models (532). If there are enough such memory segments, the multiple AI models are mapped to the embedded memory (534). If there are not enough such memory segments, it is determined that the integrated AI circuit chip fails the test (540).

The various analytics or determination steps of FIG. 5 may be performed by the memory controller 120, a separate test system, and a combination thereof. For example, a chip for the integrated AI circuit with embedded memory may be designed with test I/O and the chip may be inserted onto a test board. Data may be written to and read from the embedded memory from the test board via the test I/O to determine the error bits at, for example, the memory segment level. Other analytics steps of FIG. 5, such as determining bit error tolerance of the AI models may be performed by a simulation system in which the AI models are loaded with the model parameters adjusted to simulate model tolerance to bit errors at the model level, the network layer level, the parameter level, and the bit level. The resulting memory mapping rules, for example, may be stored in a read-only memory section on the integrated AI circuit chip and used by the memory controller 120 for implementing the various level of mapping of memory segments as discussed above and below.

Figure 6:
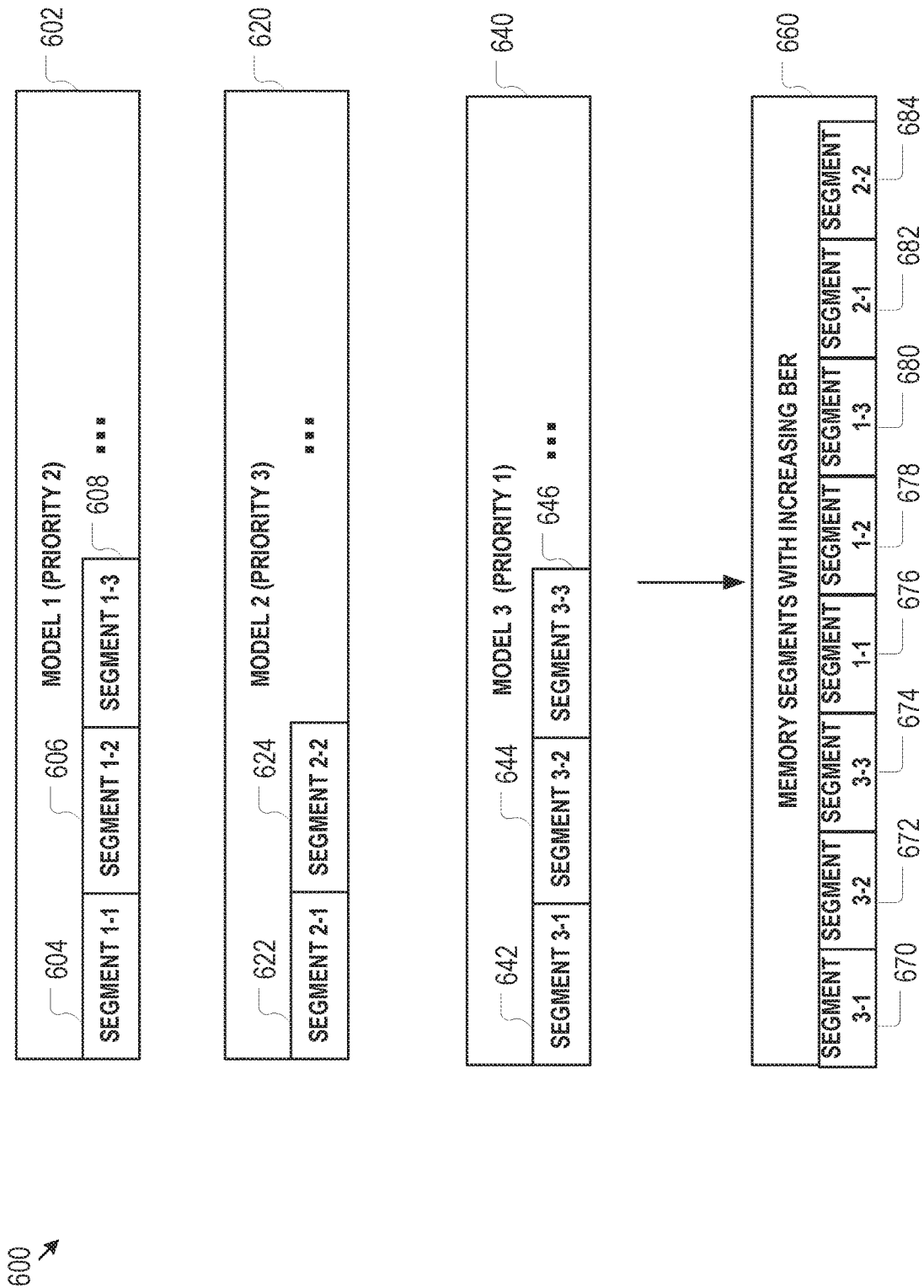
FIG. 6 shows exemplary mapping of embedded memory to parameters of AI networks at a network or model level.

FIG. 6 illustrates in 600 exemplary mapping of memory segments of the embedded memory of the integrated AI circuit to AI model parameters at the network level. As shown in FIG. 6, the AI models to be deployed in the integrated AI circuit may comprise multiple AI models/networks, including but not limited to AI model 1 (602), AI model 2 (620), and AI model 3 (640). Each of these AI models may include model parameters needing one or more memory segments to store. As such, the model parameters for each of these AI models may be packed into one or more data segments. For example, model 1 (602) may be packed into data segments 1-1 (604), data segment 1-2 (606), and data segment 1-3 (608). Likewise, model 2 (620) may be packed into data segments 2-1 (622) and data segment 2-2 (624), and model 3 (640) may be packed into data segments 3-1 (642), data segment 3-2 (644), and data segment 3-3 (646).

As described above, priority of models/networks 602, 620, and 640 of FIG. 6 may be further analyzed and determine according to an overall tolerance of each model to memory bit errors. For example, model 3 (640) may be the most sensitive (or least bit error tolerant) model with highest priority, followed by model 1 (602), which is further followed model 2 (620). In one implementation, model parameters of AI models/networks 602, 620, and 640 may be mapped to memory segments of the embedded memory of the integrated AI circuit in a manner shown in 660 of FIG. 6. In particular, the memory segments may be sorted in an increasing order of BER, and the parameters of the AI models/networks may be mapped to the sorted memory segments in order of decreasing bit error sensitivity (or decreasing priority, or increasing bit error tolerance) of the AI models/networks. For example, as shown in 660 of FIG. 6, the data segments of the model 3 (642, 644, and 646) may be mapped to the memory segments 670, 672, and 674 with lowest BER. Likewise, the data segments of the model 1 (604, 606, and 608) may be mapped to the memory segments 676, 678, and 680 with next lowest BER, and the data segments of the model 2 (622 and 624) may be mapped to the memory segments 682 and 684 with higher BER.

In the manner described above, data segments of parameters for models with higher priority or higher bit error sensitivity are mapped to memory segments having lower BER. Overall model performance may thus be optimized. Such implementation may be employed as part of process 534 of FIG. 5. The order in which the parameter data segments within each model/network are mapped to memory segments may further follow the exemplary implementations described in and for FIGS. 7-9 below. For example, data segments 3-1, 3-2, and 3-3 (642, 644, and 646) of model 3 (640) may be packed such that mode parameters in these data segments are ordered according to bit error sensitivity at network layer level, parameter level, and/or bit level.

Figure 7:
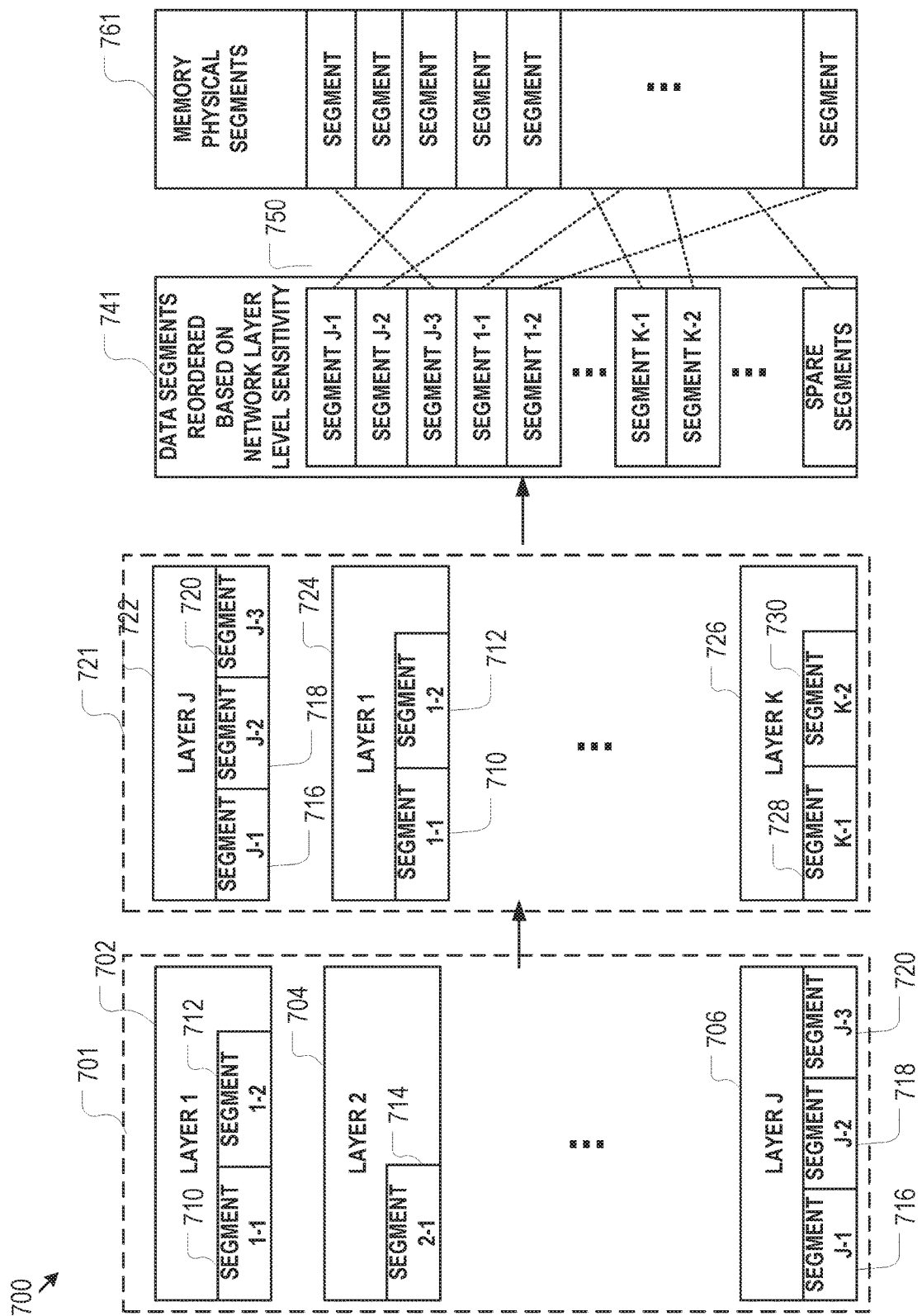
FIG. 7 shows exemplary mapping of embedded memory to parameters of AI networks at a network layer level.

FIG. 7 illustrates in 700 exemplary mapping of memory segments of the embedded memory of the integrated AI circuit to AI model parameters at the network layer level. In particular, FIG. 7 shows an AI network 701 with multiple network layers including network layer 1 (702), network layer 2 (704), and network layer J (706) in tandem. Network layer 702 may be the first convolutional layer close to input data of the network 701. Network layer 706 may be the final layer of the network 701, e.g., a fully connected layer close to the output of the network 701. Each of the network layers 702, 704, and 706 may include model parameters packed into one or more data segments. For example, network layer 702 may include data segment 1-1 (710) and data segment 1-2 (712). Likewise, network layer 704 may include data segment 2-1 (714), and network layer 706 may include data segment J-1 (716), data segment J-2 (718), and data segment J-3 (720).

As shown in 721 of FIG. 7, network layers 702, 704, and 706 of the network 701 may be reordered according to bit error sensitivity at the network layer level. In particular, the bit error sensitivity for each network layer may be determined and sorted in order of decreasing sensitivity (or decreasing priority, or increasing bit error tolerance). For example, the final network layer J (706) may be the most bit error sensitive, followed by the first network layer 1 (712), and so on. As such, 721 shows the network layers of the model 701 reordered according to bit error sensitivity at the network layer level and 741 shows a resulting ordered sequence of data segments. Model parameters according the ordered network layers 721 and corresponding ordered data segment sequence 741 may then be mapped to memory segments 761 of the embedded memory. In particular, the mapping may be made according to BER of the memory segments, as shown by mapping 750. For example, the memory segments 761 may be ordered in order of increasing BER and the more sensitive network layers of the model may be mapped to memory segments with less BER.

The mapping at the network layer level as described above in FIG. 7 may be applied to memory mapping processes 522 and 534 of FIG. 5. Particular for process 534, the network layer level mapping may be implemented alternative or in addition to the network level mapping described above. This network layer based mapping can also be applied within the data segments of each of the models/networks 602, 620, and 640 of FIG. 6. Further, the ordering of data segments within each network layer, for example, the ordering of data segments J-1, J-2, and J-3, may be further implemented at the parameter level and/or bit level, as described below in FIGS. 8-9.

Figure 8:
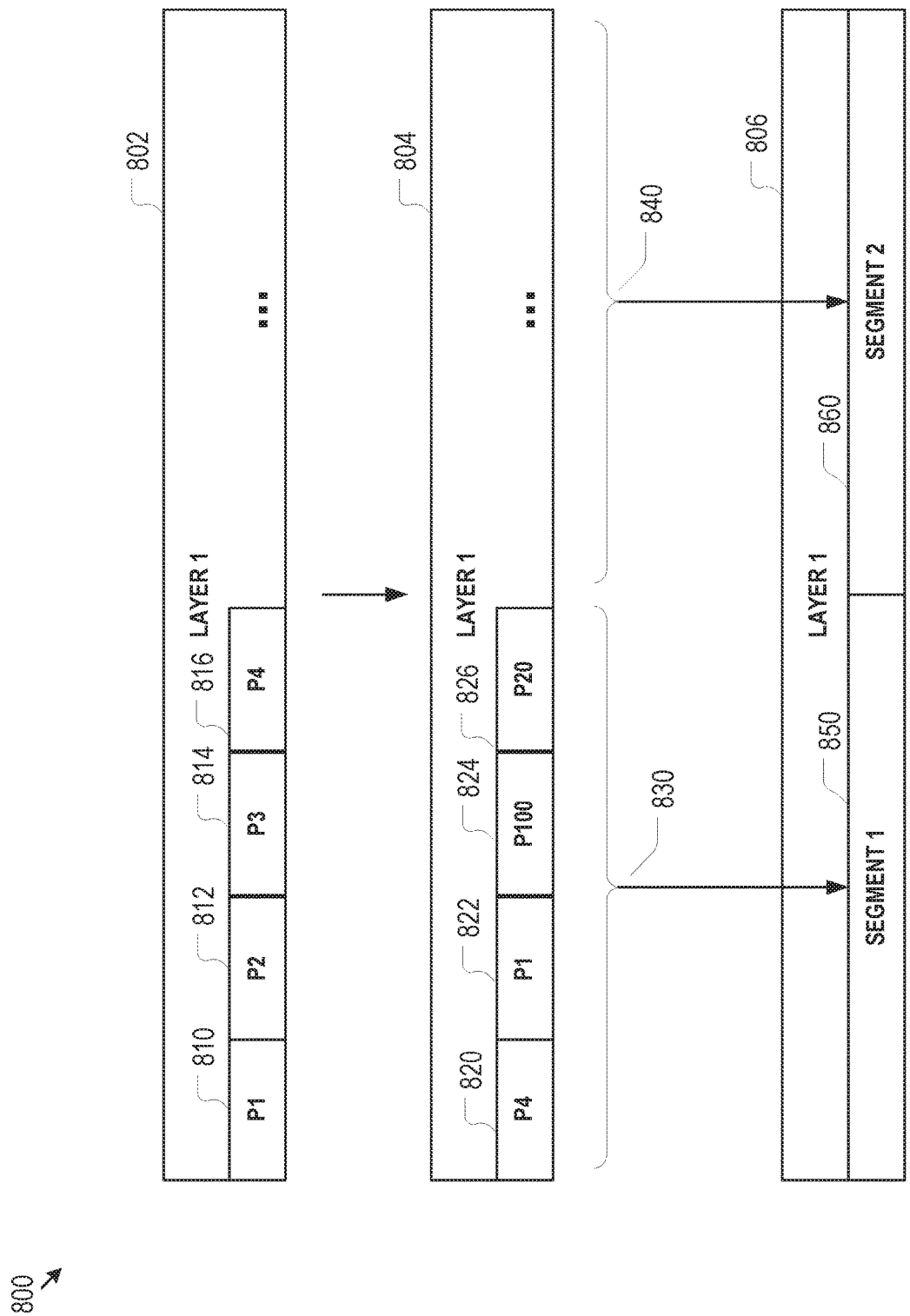
FIG. 8 shows exemplary mapping of embedded memory to parameters of AI networks at a model parameter level.

FIG. 8 illustrates in 800 exemplary mapping of memory segments of the embedded memory of the integrated AI circuit to AI model parameters at the parameter level in each network layer. In particular, 802 illustrates model parameters P1, P2, P3, and P4 (810, 812, 814, and 816) for network layer 1 of an AI model. The bit error sensitivity of each of these parameter may be determined, and these parameters may be ordered in order of decreasing sensitivity, as shown by 804. In this particular example, parameter P4 is determined to be most bit error sensitive (highest priority or lowest bit error tolerance), followed in order by parameters P1, P100, and P20. Assuming that the model parameters in network layer 802 takes two memory segments to store, the model parameters of network 802 ordered in decreasing bit error sensitivity, as shown in 804, may be packed (shown by 830 and 840) into data segments 806 for this network layer, including data segment 1 (850) and data segment 2 (860), where data segment 850 is more bit error sensitive than the data segment 860. The ordered data segments 850 and 860 in 806 of this network layer may then be mapped to memory segments of the embedded memory according to increasing BER.

The memory mapping at the parameter level within each network layer of an AI model may be applied to process 522 and process 534 of FIG. 5. This mapping may be performed across network layers of an AI model rather than within a network layer of a model. Further, such parameter level mapping may be implemented across models or networks.

Figure 9:
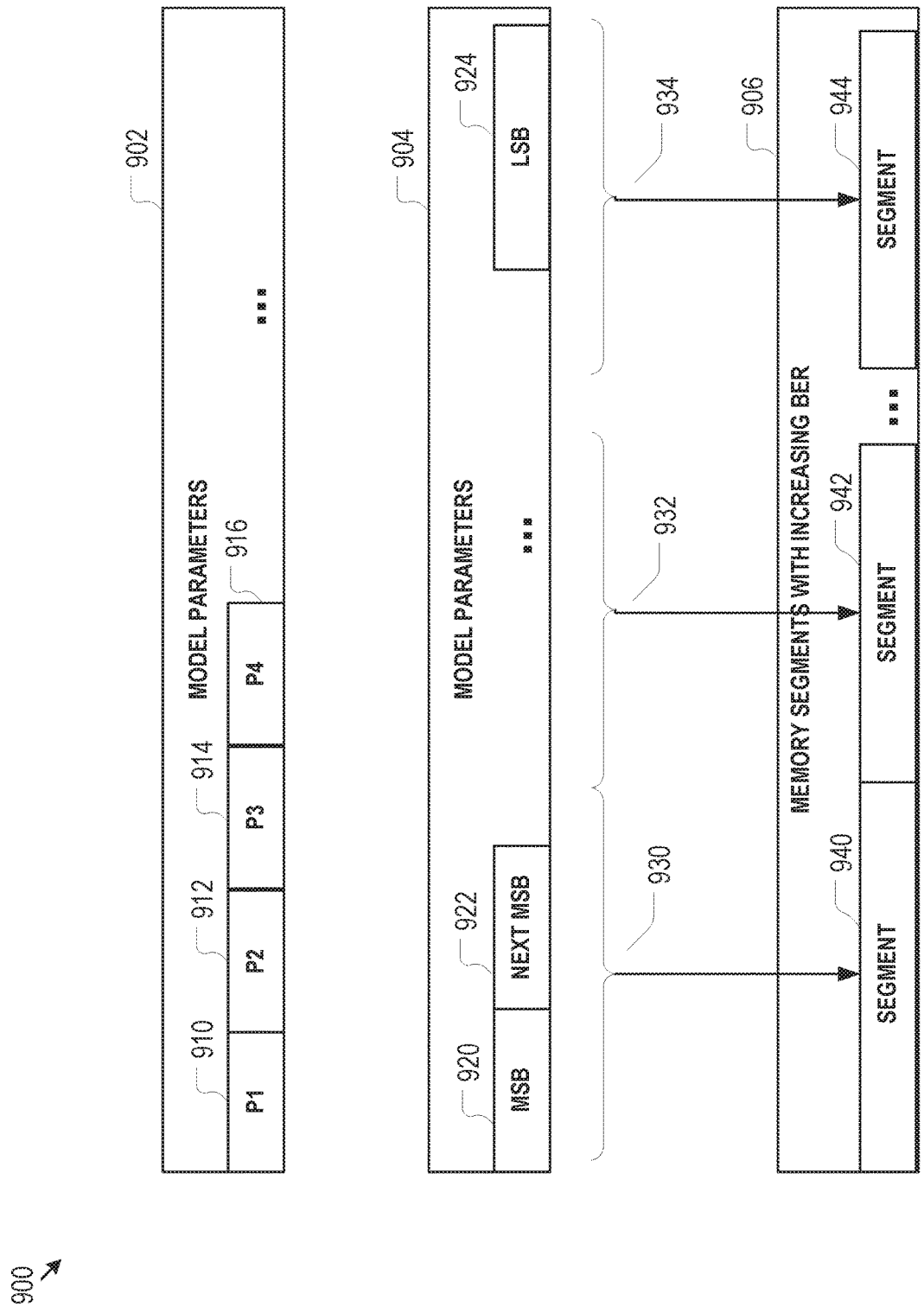
FIG. 9 shows exemplary mapping of embedded memory to parameters of AI networks at a bit level.

FIG. 9 illustrates in 900 exemplary mapping of memory segments of the embedded memory of the integrated AI circuit to AI model parameters at the bit level. In particular, a set of model parameters P1, P2, P3, and P4 (910, 912, 914, and 916) are shown for model 902. Each model parameter may comprise different bit positions such as a most significant bit (MSB), a least significant bit (LSB), and other bits ordered in between from higher significance to lower significance. For many AI models, for example, it may be determined that the models may be more sensitive to bit errors occurring in more significant bits of the parameters and less sensitive to bit errors occurring in less significant bits of the parameters. In one implementation, the bits in parameters P1, P2, P3, and P4 may be interleaved into bit groups of MSB (920), next MSB (922), . . . , and LSB (924), as shown in 904 of FIG. 9. Assuming that these model parameters of 902 require, for example, three memory segments to store, the interleaved bits of parameters shown in 904 may then be packed (as shown by 930, 932, and 934) into three data segments which are then mapped to memory segments 940, 942, and 944 in decreasing BER, as shown by 906 of FIG. 9.

The memory mapping at the bit level of an AI model may be applied to memory mapping process 522 and process 534 of FIG. 5. This mapping may be performed within a network layer, across network layer but within an AI model, and/or across AI models/networks. For example, the ordering of various data segments within a same network layer in FIG. 7 and the order of data segments within a same model/network in FIG. 6 may be implemented at the bit level as described in accordance with FIG. 9 above.

Those of ordinary skill in the art understand that the various implementations of mapping of memory segments above at the model/network level, the network layer level, the parameter level, and the bit level may be combined in any manner to achieve more optimized mapping for improved model performance. Accordingly, the mapping processes 522 and 534 of FIG. 5 may be flexibly configured with various combination of mapping at different levels. The implementation above provides methods and systems that improves an effective chip yield for the integrated AI circuits without memory redundancy and without degradation of model performance even when the overall BER of the embedded memory is above a traditionally overall threshold above which the BER was considered unacceptable.

The description and accompanying drawings above provide specific example embodiments and implementations. Drawings containing circuit and system layouts, cross-sectional views, and other structural schematics, for example, are not necessarily drawn to scale unless specifically indicated. Subject matter may, however, be embodied in a variety of different forms and, therefore, covered or claimed subject matter is intended to be construed as not being limited to any example embodiments set forth herein. A reasonably broad scope for claimed or covered subject matter is intended. Among other things, for example, subject matter may be embodied as methods, devices, components, or systems. Accordingly, embodiments may, for example, take the form of hardware, software, firmware or any combination thereof.

Throughout the specification and claims, terms may have nuanced meanings suggested or implied in context beyond an explicitly stated meaning. Likewise, the phrase "in one embodiment/implementation" as used herein does not necessarily refer to the same embodiment and the phrase "in another embodiment/implementation" as used herein does not necessarily refer to a different embodiment. It is intended, for example, that claimed subject matter includes combinations of example embodiments in whole or in part.

In general, terminology may be understood at least in part from usage in context. For example, terms, such as "and", "or", or "and/or," as used herein may include a variety of meanings that may depend at least in part on the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Reference throughout this specification to features, advantages, or similar language does not imply that all of the features and advantages that may be realized with the present solution should be or are included in any single implementation thereof. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One of ordinary skill in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

From the foregoing, it can be seen that this disclosure relates to testing of integrated artificial intelligence (AI) circuit with embedded memory to improve effective chip yield and to mapping addressable memory segments of the embedded memory to multilayer AI networks at the network level, layer level, parameter level, and bit level based on bit error rate (BER) of the addressable memory segments. The disclosed methods and systems allows for deployment of one or more multilayer AI networks in an AI circuit with sufficient model accuracy even when the embedded memory has an overall BER higher than a preferred overall threshold.

What is claimed is:

1. A method for testing an artificial intelligence integrated circuit (AIIC) including an embedded memory having multiple addressable memory segments for storing model parameters of one or more multilayer artificial intelligence (AI) networks, the method comprising:
   measuring a bit error rate (BER) for each memory segment of the multiple addressable memory segments of the embedded memory;
   determining whether an aggregated BER of the multiple addressable memory segments of the embedded memory is less than a predetermined overall BER threshold;
   when the aggregated BER is less than the predetermined overall BER threshold, determining that the AIIC passes test; and
   when the aggregated BER is not less than the predetermined overall BER threshold:
      identifying a set of priority model layers from model layers of the one or more multilayer AI networks;
      determining a subset of preferred memory segments each having BER less than the predetermined overall BER threshold from the multiple addressable memory segments;
      determining whether the subset of preferred memory segments are sufficient to hold all model parameters of the set of priority model layers;
      when the subset of preferred memory segments are sufficient to hold all model parameters of the set of priority model layers, determining that the AIIC passes test and mapping model parameters of the set of priority model layers to the subset of preferred memory segments; and
      when the subset of preferred memory segments are not sufficient to hold all model parameters of the set of priority model layers, determining that the AIIC fails test.

2. The method of claim 1, wherein the one or more multilayer AI networks comprise a single multilayer AI network and the set of priority model layers comprise all model layers of the single multilayer AI network.

3. The method of claim 2, further comprising:
   sorting the set of priority model layers in decreasing priority;
   sorting the subset of preferred memory segments in increasing BER; and
   mapping the set of priority model layers to the subset of preferred memory segments from higher priority and lower BER to lower priority and higher BER.

4. The method of claim 1, wherein the one or more multilayer AI networks comprise a single multilayer AI network and the set of priority model layers comprise a subset of model layers of the single multilayer AI network, and wherein the method further comprises:
   sorting model layers of the single multilayer AI network in decreasing priority;
   sorting the multiple addressable memory segments in increasing BER; and
   mapping the model layers of the single multilayer AI network to the multiple addressable memory segments from higher priority and lower BER to lower priority and higher BER.

5. The method of claim 1, wherein the one or more multilayer AI networks comprise a plurality of multilayer AI networks, the method further comprising:
   dividing the plurality of multilayer AI networks into a set of priority multilayer AI networks and a remaining set of multilayer AI networks; and
   including all model layers of the set of priority multilayer AI networks into the set of priority model layers.

6. The method of claim 1, wherein the one or more multilayer AI networks comprise a plurality of multilayer AI networks and wherein the set of priority model layers comprises at least one model layer from each of the plurality of multilayer AI networks.

7. The method of claim 1, wherein mapping model parameters of the set of priority model layers to the subset of preferred memory segments comprises:
   sorting the set of priority model layers in decreasing priority;
   sorting the subset of preferred memory segments in increasing BER; and
   mapping the set of priority model layers to the subset of preferred memory segments from higher priority and lower BER to lower priority and higher BER.

8. The method of claim 1, further comprising:
   when the subset of preferred memory segments are sufficient to hold model parameters of the set of priority model layers, mapping model parameters of model layers other than the set of priority model layers to memory segments of a plurality of memory segments other than memory segments of the subset of preferred memory segments that are already mapped to the set of priority model layers.

9. The method of claim 8, wherein mapping model parameters of model layers other than the set of priority model layers to memory segments of the plurality of memory segments other than memory segments of the subset of preferred memory segments that are already mapped to the set of priority model layers comprises:
sorting the model layers other than the set of priority model layers in decreasing priority;
sorting the memory segments other than the memory segments of the subset of preferred memory segments that are already mapped to the set of priority model layers in increasing BER; and
mapping the model layers other than the set of priority model layers to the memory segments other than the memory segments of the subset of preferred memory segments that are already mapped to the set of priority model layers from higher priority and lower BER to lower priority and higher BER.

10. The method of claim 1, wherein at least one of the set of priority model layers takes two or more memory segments to hold, and wherein the method, when mapping model parameters of the set of priority model layers to the subset of preferred memory segments, further comprises:
sorting model parameters in the at least one of the set of priority model layers that takes at least two memory segments to hold according to a parameter priority; and
mapping the at least one of the set of priority model layers that takes at least two memory segments to hold into the subset of preferred memory segments according to the parameter priority and the sorted model parameters in the at least one of the set of priority model layers that takes at least two memory segments.

11. The method of claim 1, wherein mapping model parameters of the set of priority model layers to the subset of preferred memory segments comprises:
packing bits of model parameters of the set of priority model layers to reorder the bits from most significant bits to least significant bits; and
mapping the reordered bits of the model parameters of the set of priority model layers to the subset of preferred memory segments.

12. The method of claim 11, wherein the set of priority model layers are further sorted in order of priority and packing bits of model parameters of the set of priority model layers is performed within each of the set of priority model layers.

13. The method of claim 11, wherein the set of priority model layers are further sorted in order of priority and packing bits of model parameters of the set of priority model layers is performed across the set of priority model layers from most significant bits to least significant bits and in descending order of priority.

14. The method of claim 1, wherein the predetermined overall BER threshold is higher than 1%.

15. The method of claim 1, further comprising removing, from the multiple addressable memory segments, memory segments having BER higher than a predetermined defective-segment BER threshold from mapping.

16. An integrated circuit, comprising:
an artificial intelligence (AI) logic circuit for implementing one or more multilayer AI networks;
embedded memory having multiple addressable memory segments in communication with the AI logic circuit for storing model parameters of the one or more multilayer AI networks;
a memory controller configured to:
maintain a first map of bit error rate (BER) for the multiple addressable memory segments at memory segment level;
determine a subset of preferred memory segments each having BER less than a predetermined overall BER threshold from the multiple addressable memory segments;
maintain a second map of priority level for model layers of the one or more multilayer AI networks;
determine a set of priority model layers from model layers of the one or more multilayer AI networks; and
when the subset of preferred memory segments are sufficient to hold all model parameters of the set of priority model layers, map model parameters of the set of priority model layers to the subset of preferred memory segments according to the first map and the second map.

17. The integrated circuit of claim 16, wherein the one or more multilayer AI networks comprise a single multilayer AI network and the set of priority model layers comprise all model layers of the single multilayer AI network.

18. The integrated circuit of claim 16, wherein the first map comprises mapping between BER and the multiple addressable memory segments in order of increasing BER and wherein the second map comprises mapping between priority level and model layers of the one or more multilayer AI networks in order of decreasing priority level.

19. The integrated circuit of claim 16, wherein the one or more multilayer AI networks comprise a plurality of multilayer AI networks, and wherein the memory controller is further configured to:
divide the plurality of multilayer AI networks into a set of priority multilayer AI networks and a remaining set of multilayer AI networks; and
including all model layers of the set of priority multilayer AI networks into the set of priority model layers.

20. The integrated circuit of claim 16, wherein the memory controller, when configured to map model parameters of the set of priority model layers to the subset of preferred memory segments according to the first map and the second map, is further configured to:
pack bits of model parameters of the set of priority model layers to reorder the bits from most significant bits to least significant bits; and
map the reordered bits of the model parameters of the set of priority model layers to the subset of preferred memory segments.

* * * * *

UNITED STATES PATENT AND TRADEMARK OFFICE
CERTIFICATE OF CORRECTION

PATENT NO. : 10,733,039 B2
APPLICATION NO. : 16/230020
DATED : August 4, 2020
INVENTOR(S) : Chyu-Jiuh Torng et al.

Page 1 of 1

It is certified that error appears in the above-identified patent and that said Letters Patent is hereby corrected as shown below:

On the Title Page

Left column, item (54), insert -- IMPROVING -- before "EFFECTIVE CHIP YIELD FOR ARTIFICIAL INTELLIGENCE INTEGRATED CIRCUIT WITH EMBEDDED MEMORY"

Signed and Sealed this
Twenty-ninth Day of September, 2020

Andrei Iancu
*Director of the United States Patent and Trademark Office*